US006803331B2

United States Patent
Hölzl et al.

(10) Patent No.: US 6,803,331 B2
(45) Date of Patent: Oct. 12, 2004

(54) PROCESS FOR THE HEAT TREATMENT OF A SILICON WAFER, AND SILICON WAFER PRODUCED

(75) Inventors: Robert Hölzl, Postmünster (DE); Christoph Seuring, Burghausen (DE); Reinhold Wahlich, Tittmoning (DE); Wilfried Von Ammon, Hochburg/Ach (AT)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 10/357,601

(22) Filed: Feb. 4, 2003

(65) Prior Publication Data

US 2003/0148634 A1 Aug. 7, 2003

(30) Foreign Application Priority Data

Feb. 7, 2002 (DE) ......................................... 102 05 084

(51) Int. Cl.[7] .............................................. H01L 21/26
(52) U.S. Cl. ...................... 438/795; 438/471; 257/617; 117/2; 117/3; 117/13
(58) Field of Search ................................ 438/471, 795; 257/617; 117/2–3, 13

(56) References Cited

U.S. PATENT DOCUMENTS

| | | | | |
|---|---|---|---|---|
| 6,139,625 | A | * 10/2000 | Tamatsuka et al. ........... | 117/19 |
| 6,228,164 | B1 | 5/2001 | Ammon et al. | |
| 6,245,311 | B1 | 6/2001 | Kobayashi et al. | |
| 6,336,968 | B1 | 1/2002 | Falster | |
| 6,503,594 | B2 | * 1/2003 | Park .......................... | 428/64.1 |
| 6,642,123 | B2 | * 11/2003 | Mun et al. ................... | 438/402 |
| 6,680,260 | B2 | * 1/2004 | Akiyama et al. ............ | 438/766 |
| 2003/0056715 | A1 | * 3/2003 | Tachikawa et al. ........... | 117/30 |
| 2003/0134492 | A1 | * 7/2003 | Lerch et al. ................. | 438/503 |

FOREIGN PATENT DOCUMENTS

| | | |
|---|---|---|
| DE | 199 24 649 | 11/2000 |
| DE | 199 25 044 | 12/2000 |
| DE | 199 41 902 | 3/2001 |
| DE | 10055648 | 8/2001 |
| DE | 10055648 A1 | * 8/2001 ............ C30B/29/06 |
| EP | 829 559 | 3/1998 |
| EP | 926 718 | 6/1999 |
| EP | 942 077 | 9/1999 |
| EP | 1087042 | 3/2001 |
| WO | 98/38675 | 9/1998 |

OTHER PUBLICATIONS

English Derwent Abstract AN 2001–309273 corresponding to DE19925044.
English Derwent Abstract AN 2001–103979 corresponding to DE19924649.
English Derwent Abstract AN 1998–161363 corresponding to EP829559.
English Derwent Abstract AN 2001–204398 corresponding to DE 19941902.
G. Kissinger et al., Electrochem. Soc. Proc. 98–1 (1998), 1095.
Hull, R. (Ed.), Properties of Crystalline Silicon, The Institution of Electrical Engineers, 1999 p. 489ff.
Huff, H. R., Fabry L., Kishino S., Semiconductor Silicon 2002, vol. 2, The Electrochemical Society, p. 545.
English Derwent Abstract AN 2001–607934 corresponding to DE 10055648.

* cited by examiner

Primary Examiner—John F. Niebling
Assistant Examiner—Jennifer M. Kennedy
(74) Attorney, Agent, or Firm—Collard & Roe, P.C.

(57) ABSTRACT

A process for the heat treatment of a silicon wafer, during which the silicon wafer is at least temporarily exposed to an oxygen-containing atmosphere, the heat treatment taking place at a temperature which is selected in such a way that the inequality $$[Oi] < [Oi]^{eq}(T)\exp\left(\frac{2\sigma_{SiO_2}\Omega}{rkT}\right)$$

is satisfied, where $[O_i]$ is the oxygen concentration in the silicon wafer $[Oi]^{eq}(T)$ is the limit solubility of oxygen in silicon at a temperature T, $\sigma_{SiO_2}$ is the surface energy of silicon dioxide $\Omega$ is the volume of a precipitated oxygen atom, r is the mean COP radius and k is the Boltzmann constant. A silicon wafer made by the above process.

11 Claims, No Drawings

PROCESS FOR THE HEAT TREATMENT OF A SILICON WAFER, AND SILICON WAFER PRODUCED

BACKGROUND OF THE INVENTION

1. Field of the Invention

The invention relates to a process for the heat treatment of a silicon wafer, and to a silicon wafer produced using this process which is substantially free of vacancy agglomerates (COPs).

2. The Prior Art

Silicon single crystals, which are generally produced using the Czochralski crucible pulling process or using the crucible-free float zone process, have a number of impurities and defects. The single crystals are divided into wafers, subjected to a considerable number of processing steps in order, for example, to obtain the desired surface quality, and finally are generally used for the fabrication of electronic components. If no special precautions are taken, the above-mentioned defects are also located at the surface of the wafers, where they may have an adverse effect on the functioning of the electronic components fabricated thereon.

One significant type of defect is what are known as COPs (crystal originated particles), groups of vacancies which combine to form small voids with sizes of typically between 50 and 150 nm. These defects can be measured using numerous methods. Partial etching of the defects by means of a SC1 solution ($NH_3/H_2O_2/H_2O$) at approximately 85° C. for 20 min followed by light scatter measurement is one possible option for testing for COPs on the wafer surface. Partial etching of the defects by means of a Secco etch for 30 min, removing approximately 30 $\mu$m of silicon, followed by counting, also makes it possible to reveal these defects. If the defects which have what is known as a flag are counted, they are referred to as FPDs (flow pattern defects). The result obtained is an FPD density per unit area, which can be converted into a density per unit volume taking account of the material removed during the preparatory etch. The same defects can also be measured by means of IR-LST (infra-red light scattering tomography), in which an Nd-YAG laser beam is scattered at the defects in the silicon wafer and the scattered light is detected at an angle of 90° to the laser beam. These defects are referred to as LSTD defects after their measurement method.

Numerous component parameters are adversely affected by the COPs when components are being fabricated on the semiconductor wafer. Therefore, it is necessary for these defects to be removed at least in the layer of a silicon wafer which is active in terms of the components. According to the prior art, there are three possible ways of achieving this objective:

By maintaining an accurately defined process window during the crystal pulling, it is possible to produce a single crystal which is free of vacancies and therefore also free of vacancy agglomerates (COPs). On account of the low pulling rate in a range <0.5 mm/min, however, the pulling of the crystals entails considerable costs. Furthermore, the tight process window leads to low yields, which likewise has adverse effects on the economic viability of the process. A further drawback of the silicon produced in this way is that it does not have a gettering capacity on account of the absence of vacancies. The relationship between vacancies, interstitial oxygen and the gettering capacity of a silicon wafer is described in more detail in G. Kissinger et al., *Electrochem. Soc. Proc.* 98-1 (1998), 1095.

As an alternative to producing a COP-free single crystal, it is possible for an additional silicon layer to be epitaxially deposited on the surface of a silicon wafer which includes COPs. On account of the low growth rate during the deposition, an epitaxial layer, unlike a conventional single crystal produced using the Czochralski process, has a virtually perfect crystal structure and is usually free of COPs. The deposition of an epitaxial layer is a complex process step which makes the product significantly more expensive. Furthermore, many component processes require silicon wafers which are defect-free at the surface down to a depth of at least 10 $\mu$m. Depositing such a thick epitaxial layer is very time-consuming and therefore uneconomical.

The third alternative consists in exposing a silicon wafer which has been produced from a conventional single crystal to temperatures of 1200° C. or higher for one to two hours under an argon or hydrogen atmosphere, as described, for example in EP 829 559 A1. Numerous tests show that COPs at the wafer surface are then annealed, resulting in a COP-free layer close to the surface. However, the annealing process is time-consuming and therefore expensive.

Silicon carbide bolts are required to hold the wafers during the annealing process at the high temperatures of over 1200° C. This always entails the risk of metal contamination. Metals which are bound in the silicon carbide can easily be distributed through the process chamber as a result of the procedure being carried out at 1200° C. under argon or hydrogen, and as a result can reach the silicon wafer.

Both in the case of epitaxy and in the case of COP free palling, the nucleation centers for oxygen precipitation which are typically formed during the crystal pulling are reduced in such a manner that there are insufficient nucleation centers available in the subsequent component process. Therefore it is impossible for getter centers to grow in sufficient numbers.

This problem can be solved with the aid of an RTA (rapid thermal annealing) treatment, as described for example in WO 98/38675 or DE 199 24 649 A1. At the high temperature, a large number of vacancies are formed and during the subsequent rapid cooling they can only diffuse to the surface in regions which are close to the surface, whereas in the bulk of the silicon wafer they are retained. Therefore, anomalous oxygen precipitation, which is in turn responsible for getter centers, may take place during the subsequent component process. However, this additional RTA treatment in turn increases the production costs of the silicon wafer.

U.S. Pat. No. 6,245,311 describes a method of reducing the COP density at the surface of the silicon wafer by means of a multistage RTA process. An RTA treatment is preferable to a batch process in terms of time and throughput. The various steps, which are carried out at different temperatures and under different atmospheres, are necessary in order to counteract the roughening of the wafer surface resulting from the use of a hydrogen-containing atmosphere.

EP 1 087 042 A1 describes a nitrogen-doped single crystal in which the COPs have a particular form. On account of the large surface area/volume ratio, the COPs can be eliminated in a layer close to the surface of a silicon wafer produced from the crystal, down to a depth of approx. 0.5 $\mu$m. This is by means of an RTA step, so that the COP density in the surface layer is reduced to approx. 50% or less of the COP density in the bulk of the wafer.

EP 926 718 A2 has described a conventional RTA process at temperatures over 1200° C. in a reducing atmosphere, e.g. in a hydrogen-containing atmosphere, for dissolving the COPs close to the surface. However, the starting material used is silicon wafers which have been produced from a single crystal which has been pulled under special conditions using the Czochralski process. The single crystal is pulled at a rate of at least 0.6 mm/min and has an oxygen concentration of at most 16 ppma (corresponds to $6.4 \cdot 10^{17}$ at/cm$^3$). On account of the process parameters selected, the COPs formed during the crystal pulling are relatively small and can therefore be dissolved easily during the RTA step.

All the processes for the heat treatment with a view to eliminating COPs which have been disclosed hitherto are based on the diffusion of oxygen out of the surface layer of the silicon wafer. The oxygen atoms of the oxide skin of the COPs are in equilibrium with the interstitial oxygen atoms which have been incorporated in the crystal lattice. These atoms in turn are in equilibrium with the native oxide layer at the surface of the silicon wafer. If, as is customary in the case of COP annealing, the wafer is exposed to a reducing atmosphere at high temperatures, the surface oxide layer is removed by reduction. On account of the equilibria described, the interstitial oxygen atoms diffuse out of the crystal toward the surface. At the same time oxygen atoms diffuse out of the oxide skin of the COPs into the crystal lattice, so that the oxide skin of the COPs is dissolved. The COPs from which the oxide skin has been removed are in turn in equilibrium with vacancies in the crystal lattice, which likewise diffuse toward the wafer surface. Consequently, this leads to the COPs being dissolved.

Since the said diffusion processes take place very slowly, COPs can only be removed from the surface layer within a reasonable period of time. This is disadvantageous in particular in components which require a particularly deep COP-free layer at the surface. For example in the case of components in which deep trench technologies are used, COP-free layers are produced on the silicon wafer. Hitherto, the maximum depth of the components has been limited to the thickness of the COP-free layer.

Moreover, outdiffusion of oxygen can only be achieved in reducing atmospheres, but these roughen the surface and lead to contamination problems, as described above.

DETAILED DESCRIPTION OF THE INVENTION

It is an object of the present invention to avoid the abovementioned drawbacks of the prior art and in particular of providing an economically viable process for producing a silicon wafer which is free of COPs not only in a layer close to the surface but also over a significant part of the wafer thickness.

This object is achieved by a process for the heat treatment of a silicon wafer, wherein the heat treatment takes place at a temperature which is higher than the temperature at which the concentration of the interstitially dissolved oxygen is equal to its saturation concentration, the saturation concentration being the oxygen concentration which is established when the interstitially dissolved oxygen is in equilibrium with the oxide skin of a COP.

According to the invention, the temperature at which the heat treatment is carried out is selected according to $$[Oi] < [Oi]^{eq}(T)\exp\left(\frac{2\sigma_{SiO_2}\Omega}{rkT}\right). \quad (1)$$

In this inequality [$O_i$] denotes the oxygen concentration in the silicon wafer, or more accurately the concentration of the interstitially dissolved oxygen, which is generally determined by FTIR spectroscopy. [$Oi$]$^{eq}$(T) is the solubility limit of oxygen in silicon at a given temperature T. A function of this type is described, for example, in Hull, R. (Ed.), "*Properties of Crystalline Silicon*", *The Institution of Electrical Engineers, London*, 1999, pp. 489ff. $\sigma_{SiO_2}$ the surface energy of silicon dioxide (SiO$_2$), which is given as 310 erg/cm$^2$ in Huff, H. R., Fabry L., Kishino S (Eds.), "*Semiconductor Silicon 2002*", Volume 2, *The Electrochemical Society, Pennington*, 2002, page 545. $\Omega$ is the volume of a precipitated oxygen atom, which can be calculated using the relationship $\Omega = M_{SiO_2}/(2\rho_{SiO_2} N_R)$ from the molar mass $M_{SiO_2}$ and the density $\rho_{SiO_2}$ Of silicon dioxide and the Avogadro's number $N_R$. r represents the mean COP radius, k represents the Boltzmann constant and T represents the temperature in K.

For the process according to the invention to succeed, it is crucial for the temperature to be selected to be sufficiently high for the oxygen concentration in equilibrium with the oxide skin of a COP surface (i.e. the right-hand side of the inequality) to exceed the concentration of interstitially dissolved oxygen atoms [$O_i$]. Therefore, the concentration of the interstitial oxygen is below its saturation concentration, so that the oxide skin of the COPs can dissolve through diffusion of the oxygen atoms into the crystal lattice. The oxide skin of the COPs dissolves through diffusion of the oxygen atoms into the crystal lattice wherever the abovementioned temperature condition is satisfied. After the oxide skin has been lost the COPs begin to shrink through diffusion of vacancies or interstitial silicon atoms, so that the COPs are dissolved.

By contrast, the annealing process according to the prior art is based on the outdiffusion of oxygen at the surface of the silicon wafer. The interstitially dissolved oxygen diffuses out at the surface. The COPs, which are covered with a thin oxide skin with a thickness of about 2 nm, lose their oxide skin on account of the Le Chatelier's principle. They then shrink continuously, since a silicon wafer thermodynamically represents an open system, so that the vacancies which are in equilibrium with the COPs can diffuse out at the surface. In the bulk of the wafer, the oxygen cannot diffuse out. Instead, in this region the COPs begin to fill up with oxide and then to become larger.

Unlike with the annealing process according to the prior art, in the process according to the invention, the COPs in the bulk also dissolve. This is because outdiffusion of oxygen is not required, on account of the high temperature which is selected according to the invention and leads to oxygen subsaturation.

The invention therefore makes it possible to produce a silicon wafer which is free of COPs not only in a layer close to the surface but also over a significant part of the thickness of the wafer. That is over at least 50% of the wafer thickness, to be understood as meaning that the COP density is less than 10 000 cm$^{-3}$. A silicon wafer of this type can be polished without problems after the heat treatment without a significant part of the COP-free layer being removed. This is the case with wafers which have been subjected to a heat treatment in accordance with the prior art. Moreover, silicon wafers which have been treated in accordance with the invention are also suitable for the fabrication of particularly "deep" components, for example, using a deep trench technology.

However, given a suitable selection of process parameters, the invention can also be used only to reduce the COP density in the bulk of the silicon wafer, so that a COP density of more than 10 000 cm$^{-3}$ is retained after the heat treatment. This can be achieved by means of a suitably short process time combined, at the same time, with an asymmetrical point defect profile which in turn can be established by means of different process atmospheres on the wafer front surface and wafer back surface. This option can be utilized to further reduce the process time, which in turn increases the economic viability of the process.

A further important difference from the prior art consists in the fact that according to the invention the silicon layer does not have to be oxygen-depleted close to the surface, since the dissolution of the COPs is not, as in the prior art, based on outdiffusion of oxygen. Instead it is based on subsaturation of the oxygen as a result of the high temperature selected in accordance with the invention. Therefore, the process according to the invention can be carried out under any desired atmosphere which also contains oxygen, at least from time to time. By contrast, the processes according to the prior art are limited to the special atmospheres of hydrogen or argon. Therefore, with the process according to the invention it is possible to avoid the roughening of the wafer surface which occurs with hydrogen- or argon-containing atmospheres.

Furthermore, avoiding hydrogen significantly reduces the potential danger. Moreover, the use of a readily oxidizing atmosphere makes it possible to significantly reduce the risk of contamination by metal compared to a hydrogen atmosphere.

The starting material used for the heat treatment according to the invention is preferably silicon wafers with a low oxygen concentration. This is because in this case the temperature required to satisfy inequality (1) is reduced, as the table below demonstrates. An oxygen concentration of $[O_i]<7\cdot 10^{17}$ at/cm$^3$ is particularly preferred. In the case of the Czochralski process, this can be achieved, for example by altered process parameters such as crucible rotation. The lower the oxygen concentration in the silicon crystal, the lower the minimum temperature for the heat treatment process according to the invention. A reduction in the process temperature in turn reduces the outlay on apparatus and the time required for heating and cooling, and therefore the process costs.

The time required to dissolve the oxide skin of the COPs is also dependent on the thickness of the oxide skin (cf. table). Thus in the context of the process according to the invention it is preferable to use a starting material whose COPs have the thinnest possible oxide skin. The thickness of the oxide skin is preferably less than 4 nm, particularly preferably less than 2 nm. This is achieved by means of a low oxygen concentration and rapid cooling rates during the crystal pulling in a temperature range from 1200° C. to 600° C.

The time which is required to dissolve the COPs from which the oxide skin has been removed is substantially dependent on the size of the COPs (cf. Table). Therefore, it is preferable for the starting material used for the heat treatment according to the invention to be silicon wafers. These wafers have been obtained from a single crystal whose pulling process has been controlled in such a way that a high concentration of very small COPs is formed. In the case of a silicon crystal with a diameter of 300 mm, the mean COP diameter should be less than 160 nm, preferably less than 150 nm and particularly preferably less than 120 nm. For silicon crystals with a diameter of 200 mm, COP sizes of <100 nm, preferably <80 nm, particularly preferably <60 nm are to be selected. In the pulling process, this is achieved by the crystal being cooled as quickly as possible in the temperature range between 1200° C. and 900° C. For this purpose, cooling rates of from 1 to 20 K/min, preferably from 2 to 15 K/min and particularly preferably from 5 to 15 K/min have to be set within the said temperature range. In addition to the small size of the COPs which are formed, a pulling process of this type has the advantage of being associated with a relatively high pulling rate, which shortens the process time. Furthermore, pulling processes of this type in principle give high yields, which further increases the economic viability.

To further reduce the mean COP size, it is preferable to add nitrogen during the pulling process. A nitrogen concentration in the single crystal or in the silicon wafer produced therefrom which is in the range between $1\cdot 10^{13}$ and $7\cdot 10^{15}$ at/cm$^3$ is particularly preferred. Documents U.S. Pat. No. 6,228,164 B1 and DE 199 41 902 A1 describe the technical background.

The following Table summarizes the effects of the oxygen concentration $[O_i]$, of the COP diameter 2r and of the thickness d of the COP oxide skin on the temperature T required for the process according to the invention and the time t required to dissolve the COPs.

| $[O_i]$ [$10^{17}$ at/cm$^3$] | 2r [nm] | d [nm] | T [° C.] | t [sec] |
|---|---|---|---|---|
| 6.5 | 70 | 2 | 1300 | 122 |
| 6.5 | 70 | 4 | 1300 | 133 |
| 6.5 | 70 | 2 | 1350 | 41 |
| 6.5 | 120 | 2 | 1350 | 366 |
| 5 | 70 | 2 | 1220 | 714 |
| 6 | 70 | 2 | 1220 | 797 |
| 7 | 70 | 2 | 1220 | 1090 |
| 8 | 70 | 2 | 1220 | ∞ |
| 5 | 70 | 2 | 1250 | 369 |
| 6 | 70 | 2 | 1250 | 390 |
| 7 | 70 | 2 | 1250 | 432 |
| 8 | 70 | 2 | 1250 | 552 |
| 9 | 70 | 2 | 1250 | ∞ |

To further reduce the time required to dissolve the COPs, the starting material used for the process according to the invention is preferably a silicon wafer whose COPs have a morphology with a large area/volume ratio. This requirement is satisfied either by flattened or elongated COPs. One way of producing a starting material of this type is described, for example in EP 1 087 042 A1.

In the context of the process according to the invention, the silicon wafer which is to be treated is firstly heated in an RTA reactor in accordance with the prior art at a predetermined rate until the temperature range determined by the inequality (1) has been reached. The silicon wafer is then held in this temperature range for a predetermined time and is then cooled again at a predetermined rate. The entire process takes place under an atmosphere which is determined by the desired properties of the heat-treated silicon wafer.

It is preferable to select a heating rate which is as high as possible, in order not to allow the oxide skin of the COPs to grow during the heating. That is it is desirable to select a heating rate of more than 2 K/s, preferably a heating rate of more than 10 K/s and particularly preferably a heating rate of 50 K/s or more.

The time during which the temperature of the silicon wafer is held in the range which is predetermined by inequality (1) is dependent on the starting material used. As shown in the table, the annealing times can be reduced by using a starting material with small COPs and a thin COP oxide skin. The typical time is between 10 s and 15 min, preferably between 30 s and 5 min, and particularly preferably between 30 s and 4 min.

The cooling rate to be set is determined by the desired properties of the end product, i.e. of the silicon wafer after the heat treatment. If the intention is to produce a silicon wafer which does not have gettering properties and does not present any oxygen precipitation during a subsequent component process, a slow cooling operation is preferred. In the case of slow cooling, the vacancy concentration can be matched to the current temperature, i.e. the high vacancy concentration at high temperatures decreases during cooling as a result of outdiffusion of the vacancies. Therefore, after the cooling operation there is a low concentration of vacancies, so that there can be no anomalous oxygen precipitate nucleation in the subsequent thermal processes, for example, during the component fabrication. Therefore, oxygen precipitation does not take place or only takes place to a slight extent. A silicon wafer which has been treated in this manner has comparable properties to a silicon wafer which has been produced from a slowly pulled, vacancy-free COP-free single crystal ("perfect silicon").

However, if a silicon wafer with good internal gettering properties is to be produced, the cooling rate is preferably set in such a way that an RTA effect occurs, as described, for example in WO 98/38675. In the case of rapid cooling, the high vacancy concentration which is present at the high temperature which previously prevailed is "frozen" since the vacancies cannot diffuse out during the cooling operation. The high vacancy concentration leads to an anomalous oxygen precipitate nucleation during a subsequent thermal process, for example during the component fabrication. Therefore, there are sufficient nucleation centers for the oxygen precipitation (with a concentration of at least $10^7$ $cm^{-3}$). At the same time, a vacancy-free layer (denuded zone, DZ) with a thickness of at least 1 μm is formed at the wafer surface. This layer is therefore free of nucleation centers for the oxygen precipitation, i.e. the concentration of nucleation centers does not exceed a value of $10^7$ $cm^{-3}$. The cooling rate to be set is in this case in the range between 10 K/s and 120 K/s, preferably between 20 K/s and 120 K/s, and particularly preferably between 40 K/s and 120 K/s.

The invention therefore also relates to a silicon wafer which in its bulk has a density of nucleation centers for the oxygen precipitation of at least $10^7$ $cm^{-3}$ and on the wafer front surface has a zone which is free of nucleation centers and is at least 1 μm thick, and has a COP density of less than 10 000 $cm^{-3}$ down to a depth which corresponds to at least 50% of the wafer thickness.

If a vacancy profile of the type described above is produced by means of a rapid cooling process, it is particularly preferable for the silicon wafer to be subjected to what is known as a nucleation anneal following this process. In this nucleation anneal, the vacancy profile is converted into a corresponding profile of nucleation centers for the oxygen precipitation. The silicon wafer is exposed to a temperature of between 450° C. and 800° C. for from 1 min to 5 h, preferably 5 min to 2 h, particularly preferably 10 min to 2 h.

Depending on the desired properties of the end product, it is preferable for noble gases (preferably argon), hydrogen, nitrogen, oxygen and chemical compounds which contain the abovementioned elements and all mixtures which can be produced from these gases (elements or compounds) to be used as the atmosphere in the context of the process according to the invention. However, mixtures whose constituents would react uncontrollably with one another at the high temperatures required, for example mixtures which simultaneously contain hydrogen and oxygen, are excluded. At least from time to time, a nonreducing atmosphere is to be used, in order to enable the wafers to become more resistant to contamination. The silicon wafer can be heat-treated both in a uniform atmosphere and in an atmosphere which is altered during the process. The front surface and back surface of the wafer can be exposed either to the same atmosphere or to different atmospheres. The front surface is to be understood as meaning that surface of the silicon wafer on which electronic components are subsequently fabricated.

During the heat treatment according to the invention, it is preferable to use an atmosphere which contains hydrogen, argon or a mixture of argon and hydrogen. At least from time to time, however, the wafers are also to be exposed to a nonreducing atmosphere, in order to reduce the risk of contamination. In this case, after the heat treatment, the wafer surface has the same properties as after a conventional hydrogen or argon anneal. However, the silicon wafer produced in accordance with this preferred embodiment, unlike a conventionally produced wafer, does not just have a thin COP-free surface layer. The COP-free layer (i.e. the layer with a COP density of less than 10 000 $cm^{-3}$) according to the invention extends over at least 50% of the wafer thickness. This has the advantage, for example, that silicon wafers which have been treated in accordance with this embodiment of the invention can, without problems be subjected to polishing. This is in order to smooth the surface without there being a risk of the complete COP-free layer being removed by the polishing.

In a further preferred embodiment of the invention, the silicon wafer, during the heat treatment, is exposed to an atmosphere which leads to the surface of the silicon layer being covered with an oxide layer throughout the entire duration of the heat treatment. An atmosphere which contains oxygen and argon is particularly preferred. As a result, it is possible to reduce the risk of metal contamination. If the heat treatment according to the invention is carried out under an oxygen-containing atmosphere, the bulk of the silicon wafer is freed of COPs. However, in this case, this is not true of the surface, since oxygen diffuses in here, so that the COPs close to the surface do not have their oxide skin removed and consequently are not dissolved. However the surface can be removed by subsequent polishing, so that ultimately a COP-free silicon wafer is once again obtained.

In the context of the invention, it is also preferable for the wafer front surface, during the heat treatment, to be exposed at least from time to time to a gas which initiates silicon interstitials (preferably oxygen or a mixture of oxygen and a noble gas, preferably argon), but the back surface to be exposed to a gas which initiates the vacancy (preferably nitrogen or a mixture of nitrogen and a noble gas, preferably argon). This leads to an asymmetrical vacancy profile and therefore in subsequent thermal processes to an asymmetrical oxygen precipitation profile, as described in DE 199 25 044 A1. An asymmetrical vacancy profile is to be understood as meaning that the vacancy concentration along any desired straight line perpendicular to the wafer surfaces is not constant and at the same time is not symmetrical with respect to an imaginary center plane in the center between the wafer surfaces. The same applies to the "asymmetrical oxygen precipitation profile".

The difference from the silicon wafer described in DE 199 25 044 A1 once again consists in the fact that the silicon wafer which has been treated in accordance with the invention has a COP-free layer of at least 50% of the wafer thickness. The use of the abovementioned gases as atmosphere for the front surface and back surface of the silicon wafer can also be used to produce a wafer with an asymmetrical profile of the COP density. In this case, a profile of the COP size in which the COPs close to the front surface have smaller diameters than COPs close to the back surface is formed over the wafer thickness. In addition to the use of different process gases, the process temperature also has to be adapted in such a manner that a profile of this type is formed. This effect can be utilized to reduce the overall process time, which in turn increases the economic viability of the process.

In a further preferred embodiment of the invention, different process gases for the front surface and back surface of the silicon wafer, particularly preferably an oxygen-containing atmosphere for the front surface and a nitrogen-containing atmosphere on the back surface, are only used during the cooling phase. This preferred embodiment too results in the asymmetrical vacancy profile described above being formed.

If silicon wafers which have been produced from a nitrogen-doped single crystal, which has been explained in more detail above, are used for the treatment, it is thus possible to widen the application area of the process according to the invention. During the heat treatment, the vacancies no longer have to diffuse to the wafer surface, but rather can react with the dissolved nitrogen in the wafer to form nitrogen vacancy complexes. This reduces the time which is required in order to dissolve the COPs. The nitrogen close to the surface continues to diffuse out. After the wafer has been cooled, the COPs have been dissolved, the vacancies have been bound by nitrogen in the wafer bulk, while at the surface of the wafer there are no bound vacancies, since the nitrogen has diffused out at the surface. During the heat treatment according to the invention, therefore, a nitrogen concentration profile is formed, i.e. the nitrogen concentration is not constant along a desired straight line perpendicular to the wafer surfaces. Nitrogen vacancy complexes in subsequent thermal processes, for example as part of component fabrication, also lead to an anomalous oxygen precipitation. Thus wafers which are treated using this preferred embodiment of the process according to the invention have a COP-free layer of at least 50% of the wafer thickness and, in addition, a density of nucleation centers for oxygen precipitation of at least $10^7$ cm$^{-3}$ in the bulk of the silicon wafer and a zone which is free of nucleation centers at least on the wafer front surface with a thickness of at least 1 μm.

The process according to the invention for the heat treatment of a silicon wafer can be incorporated at various points in the production sequence:

For example, the heat treatment may take place after a polishing step. This is recommended in particular if the heat treatment takes place under an atmosphere which does not roughen the wafer surface or only roughens it to a slight extent, for example under an oxygen-containing atmosphere.

The other possible option consists in carrying out the heat treatment according to the invention first, and then subjecting the wafer to polishing, if appropriate after a cleaning step. This embodiment is preferred in particular if the heat treatment takes place under an atmosphere which increases the surface roughness of the silicon wafer, for example a hydrogen or argon atmosphere with an oxygen-containing atmosphere being at least partially used from time to time.

Since the silicon wafer which has been treated in accordance with the invention has a COP-free layer, the thickness of which corresponds to at least 50% of the wafer thickness, polishing is possible even after the heat treatment. By contrast, polishing of silicon wafers which have been heat-treated in accordance with the prior art in order to eliminate COPs causes problems, on account of the very small thickness of the COP-free layer. Even if only a nonreducing atmosphere, generally an oxygen-containing atmosphere, is used, this treatment is a particularly preferred embodiment, allowing the removal of defects close to the surface which may form as a result of the process sequence.

In the context of this preferred embodiment of polishing the wafer after the heat treatment, there are in turn a number of possible options. By way of example, a polished wafer can be subjected to the heat treatment according to the invention and then to a final polishing or mirror polishing step. In addition, it is possible to subject an etched wafer to the heat treatment according to the invention and then to a final polishing or mirror polishing step. However, it is particularly preferable for the silicon wafer to be subjected to a double-side polishing (and then if appropriate to a final polishing or mirror polishing) after the heat treatment according to the invention. This results in a perfect surface condition in combination with the absence of COPs in accordance with the invention.

The invention can be applied to single-crystalline silicon wafers irrespective of the crystal diameter or wafer diameter. It is preferable for the invention to be applied to wafers with a diameter of 15, 20 or 30 cm or more. Since the components which are fabricated on large-diameter silicon wafers impose significantly higher demands on the absence of defects in the silicon, it is particularly preferable to apply the invention to silicon wafers with a large diameter.

Accordingly, while a few embodiments of the present invention have been shown and described, it is to be understood that many changes and modifications may be made thereunto without departing from the spirit and scope of the invention as defined in the appended claims.

What is claimed is:

1. A process for heat treatment of a silicon wafer, comprising
    exposing the silicon wafer at least temporarily to an oxygen-containing atmosphere; and
    said heat treatment taking place at a temperature which is selected in such a way that the inequality $$[Oi] < [Oi]^{eq}(T) \exp\left(\frac{2\sigma_{SiO_2}\Omega}{rkT}\right) \quad (1)$$

is satisfied, where $[O_i]$ is the oxygen concentration in the silicon wafer $[Oi]^{eq}(T)$ is the limit solubility of oxygen in silicon at a temperature T, $\sigma_{SiO_2}$ is the surface energy of silicon dioxide, $\Omega$ is the volume of a precipitated oxygen atom, r is the mean COP radius and k is the Boltzmann constant.

2. The process as claimed in claim 1,
    wherein a starting material used for the process is a silicon wafer with an oxygen concentration $[O_i] < 7 \cdot 10^{17}$ at/cm$^3$.

3. The process as claimed in claim 1,
    wherein a starting material used for the process is a silicon wafer with a mean COP diameter of less than 160 nm.

4. The process as claimed in claim 1, comprising
    heating the silicon wafer at a predetermined heating rate until the temperature is within a range in which inequality (1) is satisfied;

holding the temperature in this range for a predetermined time;

and cooling the silicon wafer at a predetermined cooling rate.

5. The process as claimed in claim 4, wherein the time during which the temperature is within the range in which inequality (1) is satisfied, is between 10 seconds and 15 minutes.

6. The process as claimed in claim 4, comprising cooling the silicon wafer at a cooling rate of between 10 K/s and 120 K/s.

7. The process as claimed in claim 4, comprising exposing a back surface of the silicon wafer to a nitrogen-containing atmosphere at least during a cooling operation.

8. The process as claimed in claim 1, comprising polishing the silicon wafer after a heat treatment.

9. A silicon wafer comprising a front surface, a back surface, a bulk between said front surface and said back surface;

said silicon wafer having in its bulk a density of nucleation centers for oxygen precipitation of at least $10^7$ $cm^{-3}$ and on said front surface having a zone which is free of nucleation centers and is at least 1 $\mu$m thick, and having a COP density of less than 10 000 $cm^{-3}$ down to a depth which corresponds to at least 50% of wafer thickness.

10. The silicon wafer as claimed in claim 9, which has an asymmetrical vacancy concentration profile.

11. The silicon wafer as claimed in claim 9, which contains nitrogen, and has a nitrogen concentration along any desired straight line perpendicular to said wafer front and back surfaces not being constant.

* * * * *